US008975918B2

(12) United States Patent
Takemura

(10) Patent No.: US 8,975,918 B2
(45) Date of Patent: Mar. 10, 2015

(54) LOOKUP TABLE AND PROGRAMMABLE LOGIC DEVICE INCLUDING LOOKUP TABLE

(71) Applicant: Semiconductor Energy Laboratory Co., Ltd., Atsugi-shi, Kanagawa-ken (JP)

(72) Inventor: Yasuhiko Takemura, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 13/870,039

(22) Filed: Apr. 25, 2013

(65) Prior Publication Data

US 2013/0293262 A1 Nov. 7, 2013

(30) Foreign Application Priority Data

May 1, 2012 (JP) ................................ 2012-104853

(51) Int. Cl.

| | |
|---|---|
| ***G06F 7/38*** | (2006.01) |
| ***H03K 19/177*** | (2006.01) |
| ***G11C 7/10*** | (2006.01) |
| ***G11C 11/24*** | (2006.01) |
| ***H03K 19/08*** | (2006.01) |
| ***H03K 19/173*** | (2006.01) |

(52) U.S. Cl.

CPC *G11C 7/10* (2013.01); *G11C 11/24* (2013.01); *H03K 19/08* (2013.01); *H03K 19/1737* (2013.01); *H03K 19/17728* (2013.01)

USPC .................... 326/40; 326/37; 326/39; 326/46

(58) Field of Classification Search

None

See application file for complete search history.

(56) References Cited

U.S. PATENT DOCUMENTS

| | | | | |
|---|---|---|---|---|
| 4,609,986 | A | 9/1986 | Hartmann et al. | |
| 4,642,487 | A | 2/1987 | Carter | |
| 4,870,302 | A | 9/1989 | Freeman | |
| 6,127,702 | A | 10/2000 | Yamazaki et al. | |
| 6,342,792 | B1 * | 1/2002 | Huang et al. | 326/40 |
| 7,019,557 | B2 | 3/2006 | Madurawe | |
| 7,674,650 | B2 | 3/2010 | Akimoto et al. | |
| 2010/0148171 | A1 | 6/2010 | Hayashi et al. | |
| 2011/0089414 | A1 * | 4/2011 | Yamazaki et al. | 257/43 |
| 2011/0175646 | A1 | 7/2011 | Takemura et al. | |
| 2012/0274355 | A1 | 11/2012 | Nishijima | |

FOREIGN PATENT DOCUMENTS

JP 2012-044618 A 3/2012

* cited by examiner

*Primary Examiner* — Anh Tran

(74) *Attorney, Agent, or Firm* — Fish & Richardson P.C.

(57) ABSTRACT

To optimize the arrangement of configuration data stored in a configuration memory. A lookup table includes a memory configured to store configuration data, a plurality of multiplexers each configured to select one signal from a plurality of input signals in accordance with the configuration data supplied from the memory and output the one signal, and an inverter. The plurality of multiplexers are connected in a binary tree with multiple levels. The inverter is provided between one of input terminals of a multiplexer in an uppermost level and an output terminal of a multiplexer in one level lower than the uppermost level. Signal selection is performed in each of the multiplexers so that the multiplexer in the uppermost level outputs, as an output signal, one signal of all input signals of the multiplexers in a lowermost level.

16 Claims, 10 Drawing Sheets

FIG. 8A
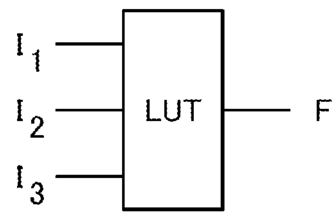
FIG. 8B
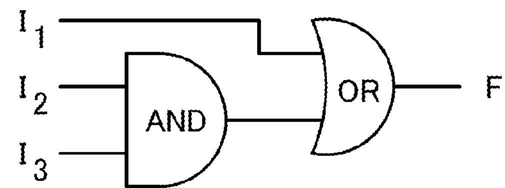
FIG. 8C
| $I_1$ | 0 | 1 | 0 | 1 | 0 | 1 | 0 | 1 |
|---|---|---|---|---|---|---|---|---|
| $I_2$ | 0 | 0 | 1 | 1 | 0 | 0 | 1 | 1 |
| $I_3$ | 0 | 0 | 0 | 0 | 1 | 1 | 1 | 1 |
| F | 0 | 1 | 0 | 1 | 0 | 1 | 1 | 1 |
FIG. 8D
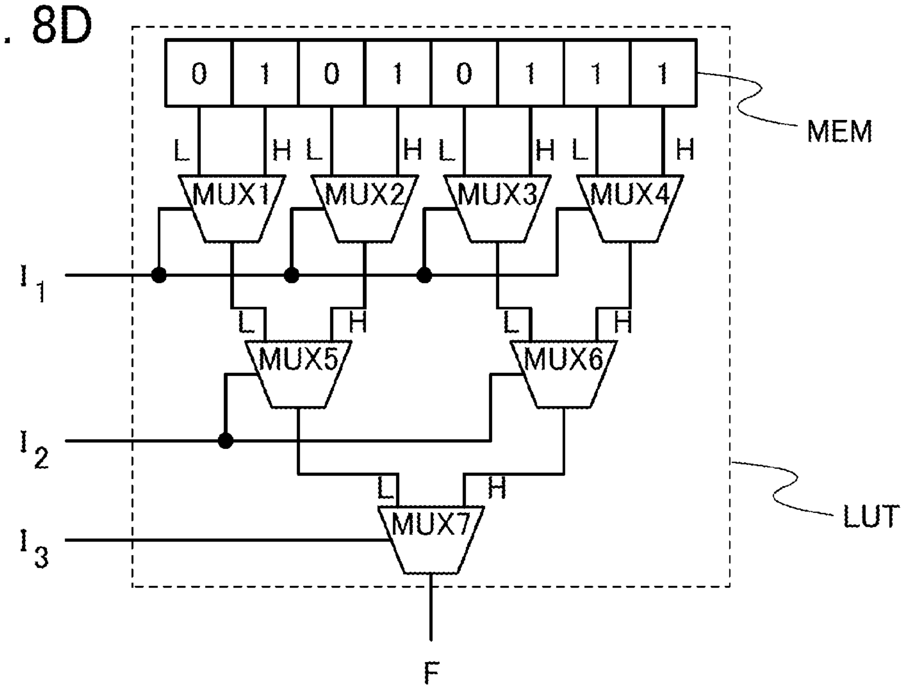

FIG. 10A

| $I_1$ | 0 | 1 | 0 | 1 | 0 | 1 | 0 | 1 |
|---|---|---|---|---|---|---|---|---|
| $I_2$ | 0 | 0 | 1 | 1 | 0 | 0 | 1 | 1 |
| $I_3$ | 0 | 0 | 0 | 0 | 1 | 1 | 1 | 1 |
| F | 0 | 1 | 0 | 1 | 0 | 1 | 1 | 1 |

FIG. 10B

| $I_1$ | 0 | 1 | 0 | 1 | 0 | 1 | 0 | 1 |
|---|---|---|---|---|---|---|---|---|
| $I_2$ | 0 | 0 | 1 | 1 | 0 | 0 | 1 | 1 |
| $I_3$ | 0 | 0 | 0 | 0 | 1 | 1 | 1 | 1 |
| F | 0 | 1 | 1 | 1 | 0 | 1 | 0 | 1 |

FIG. 10C

| $I_1$ | 0 | 1 | 0 | 1 | 0 | 1 | 0 | 1 |
|---|---|---|---|---|---|---|---|---|
| $I_2$ | 0 | 0 | 1 | 1 | 0 | 0 | 1 | 1 |
| $I_3$ | 0 | 0 | 0 | 0 | 1 | 1 | 1 | 1 |
| F | 0 | 0 | 0 | 1 | 1 | 1 | 1 | 1 |

LOOKUP TABLE AND PROGRAMMABLE LOGIC DEVICE INCLUDING LOOKUP TABLE

BACKGROUND OF THE INVENTION

1. Field of the Invention

The present invention relates to a programmable logic device. Further, the present invention relates to a semiconductor device using the programmable logic device, and an electronic device using the semiconductor device.

In this specification and the like, a semiconductor device means all types of devices that can function by utilizing semiconductor characteristics, and a transistor, a semiconductor circuit, and the like are each one form of the semiconductor device.

2. Description of the Related Art

Recently, a programmable logic device (PLD) such as a field programmable gate array (FPGA) or a complex programmable logic device (CPLD), in which the logic can be defined and changed by a user after manufacturing, has attracted attention to replace an application specific integrated circuit (ASIC) which is an integrated circuit for a specific use. The PLD has advantages such as reduction in development period and a high degree of flexibility for the change of the design as compared to the ASIC and, for this reason, has started to be incorporated in a variety of electronic devices.

For example, the PLD consists of a plurality of logic blocks and wirings connecting the logic blocks. By changing the function of at least one of the logic blocks, the function of the PLD can be changed. The logic block is formed using, for example, a lookup table (LUT) or the like. The LUT has a function of outputting a value corresponding to a pattern of an input value based on the pre-calculated table of the outputs for patterns of a plurality of input values (see Patent Document 1).

The LUT consists of a memory and multiplexers and can change the circuit structure with data stored in the memory. The data stored in this memory of the LUT or a memory that controls connections of the wirings is called configuration data, and the memory where the configuration data is stored is called a configuration memory. By rewriting the configuration data stored in the configuration memory, the circuit structure can be changed to a desired structure. Note that the configuration memory is a generic term for memory that exists in the LUT or a wiring connection circuit as described above and, in some cases, does not exist in one specific place.

For example, a 3-input 1-output LUT illustrated in FIG. 8A previously stores patterns of input values of three terminals $I_1$, $I_2$, and $I_3$ (eight patterns in total) and output values corresponding to the input patterns and outputs the stored value in accordance with the pattern of the input values. In the case of a 3-input 1-output circuit formed of an AND circuit and an OR circuit illustrated in FIG. 8B, eight patterns of the input values of the input terminals $I_1$, $I_2$, and $I_3$ and their output values (truth table) are shown in FIG. 8C. The 3-input LUT illustrated in FIG. 8A can form a desired logic circuit by using a 8-bit memory MEM and multiplexers MUX1 to MUX7 which form a binary tree circuit as illustrated in FIG. 8D.

In the case where the logic circuit illustrated in FIG. 8B is a hardware circuit, it is difficult to freely change the circuit structure after manufacturing; in contrast, in the case where a LUT is used to form the logic circuit illustrated in FIG. 8B, changing the value of an output terminal F can produce the same effect as changing the circuit structure. For example, in FIG. 8C, when the values of the output terminal F except the leftmost value are all 0, the logic circuit serves as a 3-input AND circuit; whereas when the values of the output terminal F except the leftmost value are all 1, the logic circuit serves as a 3-input OR circuit.

REFERENCE

Patent Document

[Patent Document 1] U.S. Pat. No. 7,019,557

[Patent Document 2] Japanese Published Patent Application No. 2012-44618

SUMMARY OF THE INVENTION

As described above, the LUT enables formation of a desired logic circuit. Substantially one logic circuit can be formed with a plurality of kinds of arrangements of the configuration data stored in the configuration memory. However, the arrangement of the configuration data stored in the configuration memory has not been particularly considered so far. Thus, the arrangement of the configuration data stored in the configuration memory still has room for improvement.

It is an object of one embodiment of the present invention to optimize the arrangement of configuration data stored in a configuration memory.

As described above, in forming a circuit equivalent to the circuit illustrated in FIG. 8B in the end, the connection between the three input terminals of the LUT and external wirings can have a high degree of freedom. In the case where the circuit illustrated in FIG. 8B is a PLD, it is not always necessary that the truth table of the PLD is the same as that of the circuit illustrated in FIG. 8B as long as the values of the output terminal F of the circuit match those of the truth table of the circuit illustrated in FIG. 8B. For example, the cases of connecting wirings $L_1$, $L_2$, and $L_3$ outside the LUT to the input terminals $I_1$, $I_2$, and $I_3$ of the LUT in the PLD as illustrated in FIGS. 9A to 9F are considered. Here, a circuit equivalent to the circuit in which the wirings $L_1$, $L_2$, and $L_3$ are each connected to the AND circuit or the OR circuit illustrated in FIG. 8B is formed by a LUT. The input terminals $I_1$, $I_2$, and $I_3$ can be connected to the wirings $L_1$, $L_2$, and $L_3$ in various connection combinations; there are specifically six combinations as illustrated in FIGS. 9A to 9F for connecting the input terminals $I_1$, $I_2$, and $I_3$ to the wirings $L_1$, $L_2$, and $L_3$. With any of the combinations, by rewriting the content of the memory in the LUT, a circuit equivalent to the circuit illustrated in FIG. 8B can be formed.

The truth table for the case of the connection illustrated in FIG. 9A is shown in FIG. 8C. The truth table for the case of the connection illustrated in FIG. 9B is shown in FIG. 10A. The input terminal $I_2$ and the input terminal $I_3$ that are connected to the AND circuit are interchanged between the connection illustrated in FIG. 9B and the connection illustrated in FIG. 9A, which is only a difference between the connection illustrated in FIG. 9B and the connection illustrated in FIG. 9A; accordingly, the arrangement of the values of the output terminal F is the same therebetween.

The truth table for the case of the connection illustrated in FIG. 9C is shown in FIG. 10B. The connection illustrated in FIG. 9D is obtained only by interchanging the input terminal $I_1$ and the input terminal $I_3$ that are connected to the AND circuit, and thus has the same arrangement of the values of the output terminal F as the connection illustrated in FIG. 9C.

Further, the truth table for the case of the connection illustrated in FIG. 9E is shown in FIG. 10C. The connection illustrated in FIG. 9F is obtained only by interchanging the input terminal $I_1$ and the input terminal $I_2$ that are connected to the AND circuit, and thus has the same arrangement of the values of the output terminal F as the connection illustrated in FIG. 9E.

Data writing and reading to/from the memory MEM is carried out serially. At this time, power consumption sometimes varies between the case where the same data does not continue and the case where the same data continues. For example, the case where 8-bit data is 01010111 as illustrated in FIG. 8C is compared with the case where 8-bit data is 00011111 as illustrated in FIG. 10C. Every time the parity (0 or 1) of the data changes, the potentials of bit lines also change, needing electric charge for the capacity of the bit lines accordingly. For this reason, the power consumption of the former case is three times as large as that of the latter case.

Further, there is a case in which one pulse is generated to write or read data "1", for example. In this case, as the number of data "1" increases, the power consumption increases; as the number of data "1" decreases, the power consumption decreases.

In the LUT, there is a data arrangement in the memory MEM with the smallest number of parity changes of the data or with a small number of "1". By optimizing the connection between the wirings and the LUT, such a data arrangement can be discovered.

Note that the above-described optimization is not effective for some kinds of logic circuits. For example, an OR circuit, an AND circuit, a full adder circuit, and the like have high symmetry in the output with respect to the input; and even if the connection is changed, the truth tables are not changed.

However, when considering the probabilistic combinations of logic circuits (logical function), approximately half of the configuration data stored in the configuration memory is "1" and the other half is "0". Further, when considering the configuration data of the actually designed logical functions, about a quarter of the configuration data is "1", and for this reason it is difficult to reduce the number of either one level of the data to below this proportion.

Note that the above description "the number of '1' is small and the number of '0' is large" is substantially equivalent to the description "the number of '0' is small and the number of '1' is large." Because "0" and "1" each represent an either state of data, if one state of the data is specified as "0", the other is "1". In addition, it is possible to freely specify "0". Accordingly, in the description above and below, "0" and "1" can be read as "1" and "0", respectively.

In view of the foregoing, in one embodiment of the present invention, an inverter is provided between an output terminal of one multiplexer and an input terminal of another multiplexer in a LUT. In this specification, an inverter refers to a circuit having a function of inverting input data. For example, an inverter is provided between an input terminal of a multiplexer in an uppermost level and an output terminal of one of multiplexers in one level lower than the uppermost level. Alternatively, an inverter is provided between an input terminal of a multiplexer in the second uppermost level and an output terminal of one of multiplexers in one level lower than the second uppermost level. Thus, at least one inverter is provided in a binary tree that consists of multiplexers. The position of the inverter can be optimized in accordance with the proportion of "1" in the configuration data.

One embodiment of the present invention is a lookup table including a memory configured to store configuration data, a plurality of multiplexers each configured to select one signal from a plurality of input signals in accordance with the configuration data supplied from the memory and output the one signal, and an inverter, in which the plurality of multiplexers are connected in a binary tree with multiple levels, in which the inverter is provided between one of input terminals of one multiplexer in a level and an output terminal of one multiplexer in one level lower than the one level, and in which signal selection is performed in each of the multiplexers so that the multiplexer in an uppermost level outputs, as an output signal, one signal of all input signals of the multiplexers in a lowermost level.

Another embodiment of the present invention is a lookup table including a memory configured to store configuration data, a plurality of multiplexers each configured to select one signal from a plurality of input signals in accordance with the configuration data supplied from the memory and output the one signal, and an inverter, in which the plurality of multiplexers are connected in a binary tree with multiple levels, in which the inverter is provided between one of input terminals of a multiplexer in an uppermost level and an output terminal of a multiplexer in one level lower than the uppermost level, and in which signal selection is performed in each of the multiplexers so that the multiplexer in the uppermost level outputs, as an output signal, one signal of all input signals of the multiplexers in a lowermost level.

Alternatively, the inverter can be provided between an output terminal of one of the multiplexers in the lowermost level in the LUT and an input terminal of the multiplexer in one level higher than the lowermost level.

Still another embodiment of the present invention is a lookup table including a memory configured to store configuration data, a plurality of multiplexers each configured to select one signal from a plurality of input signals in accordance with the configuration data supplied from the memory and output the one signal, and an inverter, in which the plurality of multiplexers are connected in a binary tree with multiple levels, in which the inverter is provided between an output terminal of one of the multiplexers in a lowermost level and an input terminal of the multiplexer in one level higher than the lowermost level, and in which signal selection is performed in each of the multiplexers so that the multiplexer in an uppermost level outputs, as an output signal, one signal of all input signals of the multiplexers in the lowermost level.

With any of the above-described structures of the LUT, the number of "1" contained in the configuration data stored in the memory can be reduced. This can reduce power consumed for transfer of the configuration data.

In each of the above-described lookup tables, each input terminal of the multiplexers in the lowermost level is connected to a corresponding one memory element; the memory element includes a transistor and a capacitor; the transistor includes a semiconductor film having a band gap of 3.0 eV or more; and the configuration data is stored at a node to which one of a source and a drain of the transistor and one of a pair of electrodes of the capacitor are connected.

A plurality of logic blocks each including any of the above-described lookup tables are formed, and the plurality of logic blocks are arranged in a matrix. A plurality of switch blocks and wirings are provided so as to connect the logic blocks, whereby a programmable logic device can be formed.

Different kinds of logic blocks can be arranged in one programmable logic device. For example, a plurality of logic blocks each including any of the lookup tables of embodiments of the present invention and a plurality of logic blocks each including the lookup table illustrated in FIG. 8D can be arranged. Alternatively, one logic block may include the lookup table of one embodiment of the present invention and the lookup table illustrated in FIG. 8D.

With one embodiment of the present invention, the arrangement of the configuration data stored in the configuration memory can be optimized. Specifically, in the configuration data input to the memory included in the LUT, the number of “1” can be reduced. This can reduce power consumed for transfer of the configuration data. Further, repetition of “0” in the configuration data can reduce power consumed by the programmable logic device.

BRIEF DESCRIPTION OF THE DRAWINGS

In the accompanying drawings:

FIG. 8A illustrates a 3-input 1-output LUT, FIG. 8B illustrates a 3-input 1-output circuit that consists of an AND circuit and an OR circuit, FIG. 8C shows a truth table, and FIG. 8D illustrates a 3-input 1-output LUT, FIGS. 10A to 10C are truth tables showing the output of the LUTs illustrated in FIGS. 9A to 9F.

DETAILED DESCRIPTION OF THE INVENTION

Embodiments of the present invention will be described in detail below with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below.

Embodiment 1

In this embodiment, a programmable logic device (PLD) of one embodiment of the present invention will be described with reference to FIGS. 1A and 1B, FIG. 2, FIG. 3, FIG. 4, FIG. 5, and FIG. 6.

Figure 1A:
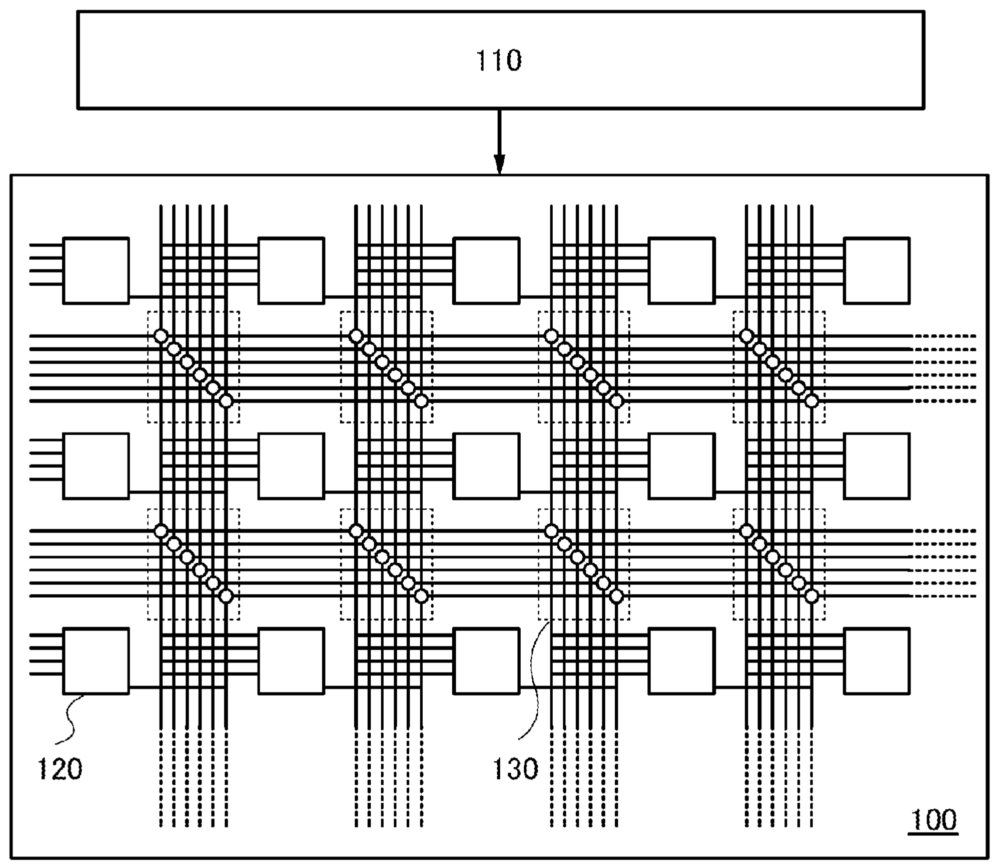
FIGS. 1A and 1B are block diagrams of a programmable logic device.

FIG. 1A is a block diagram of one mode of a programmable logic device 100. The programmable logic device 100 includes a plurality of logic blocks 120 and a plurality of switch blocks 130. The plurality of logic blocks 120 are arranged in a matrix. A plurality of wirings are connected to the logic blocks 120, and the switch blocks 130 are provided at intersections of the wirings.

Further, the programmable logic device 100 may include a multiplier, a RAM block, a PLL block, or an I/O element. The multiplier has a function of multiplying a plurality of pieces of data at high speed. The RAM block has a function of storing given data as a memory. The PLL block has a function of supplying a clock signal to a circuit in the programmable logic device 100. The I/O element has a function of controlling signal passing between the programmable logic device 100 and an external circuit.

A memory 110 consists of non-volatile memories such as flash ROMs. Configuration data is stored in the memory 110.

Figure 1B:
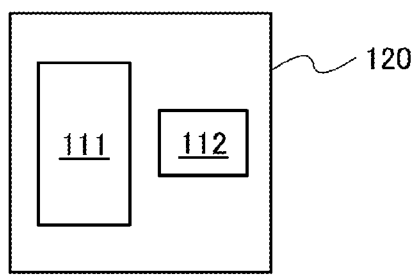

The logic blocks 120 illustrated in FIG. 1B includes a lookup table 111 and a register 112. The lookup table 111 outputs a signal in accordance with the configuration data stored in the memory 110. An output signal of the lookup table 111 and a clock signal (CLK) are input to the register 112, and the register 112 outputs a signal corresponding to the output signal of the lookup table 111 in synchronization with the clock signal (CLK). The logic block 120 may include a multiplexer which selects the output signal of the lookup table 111 or the output signal of the register 112, or the like. The logic block 120 may further include another LUT or another register.

The switch blocks 130 change electrical connections between the logic blocks 120 or between the logic blocks 120 and a circuit (e.g., a multiplier, a RAM block, a PLL block, or an I/O element) in accordance with the configuration data stored in the memory 110. For example, the switch block 130 outputs the output signal of the register 112 or the lookup table 111 included in one logic block 120 as the output signal of the logic block 120, to another logic block 120 or the like in accordance with the configuration data; thus, the logic blocks 120 can be electrically connected to each other.

It is possible to omit the register 112 from the logic block 120 illustrated in FIGS. 1A and 1B. Alternatively, both the logic block 120 with the register 112 and the logic block 120 without the register 112 may be included in the PLD. The output of the lookup table 111 can bee used as the output of the logic block 120 without the register 112.

Note that it is not necessary that the plurality of logic blocks 120 all have the same structure, and the logic blocks 120 with different structures may be arranged.

Figure 2:
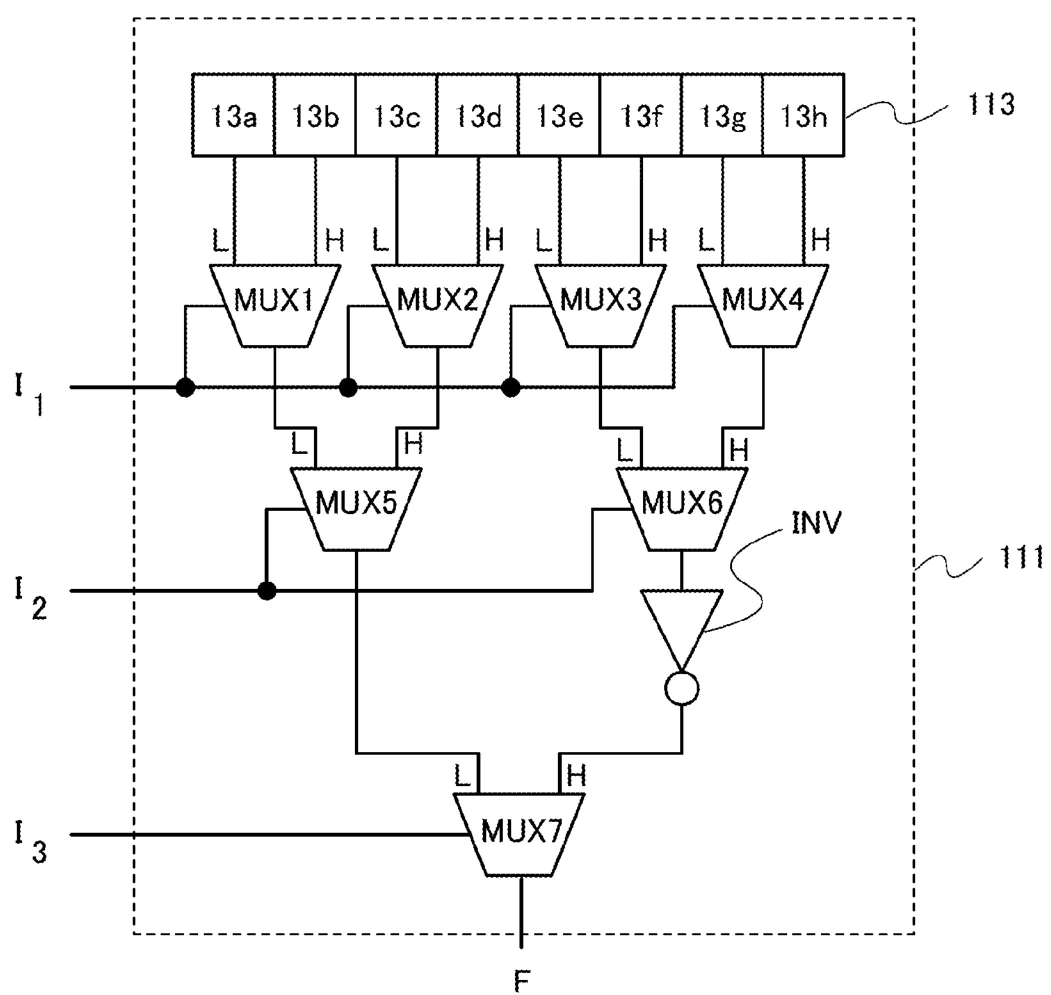
FIG. 2 illustrates a lookup table.

FIG. 2 illustrates one mode of the lookup table 111 included in the logic block 120.

In FIG. 2, the lookup table 111 includes a memory 113, a plurality of multiplexers MUX1 to MUX7, and an inverter NV.

In the lookup table 111, the memory 113 includes a plurality of memory elements 13*a* to 13*h*. In the memory 113, any of various kinds of memory elements such as volatile memories (e.g., an SRAM) or non-volatile memories (e.g., a flash memory) can be utilized.

In the lookup table 111, input terminals of the multiplexers MUX1 to MUX4 are electrically connected to the memory elements 13*a* to 13*h* included in the memory 113. Control terminals of the multiplexers MUX1 to MUX4 are electrically connected to one another and serve as an input terminal $I_1$ of the lookup table 111. Output terminals of the multiplexer MUX1 and the multiplexer MUX2 are electrically connected to two input terminals of the multiplexer MUX5, and output terminals of the multiplexer MUX3 and the multiplexer MUX4 are electrically connected to two input terminals of the multiplexer MUX6. Control terminals of the multiplexers MUX5 and MUX6 are electrically connected to each other and serve as an input terminal $I_2$ of the lookup table 111. An output terminal of the multiplexer MUX5 is connected to one input terminal of the multiplexer MUX7. Further, an output terminal of the multiplexer MUX6 is connected to the other input terminal of the multiplexer MUX7 via the inverter INV. A control terminal of the multiplexer MUX7 serves as an input terminal $I_3$ of the lookup table 111. In addition, an output terminal of the multiplexer MUX7 is an output terminal F of the lookup table 111.

On input of the configuration data to the memory 113 and the input terminals $I_1$, $I_2$, and $I_3$, the kind of arithmetic processing performed in the lookup table 111 can be determined by the multiplexers MUX1 to MUX7 and the inverter.

Figure 3:
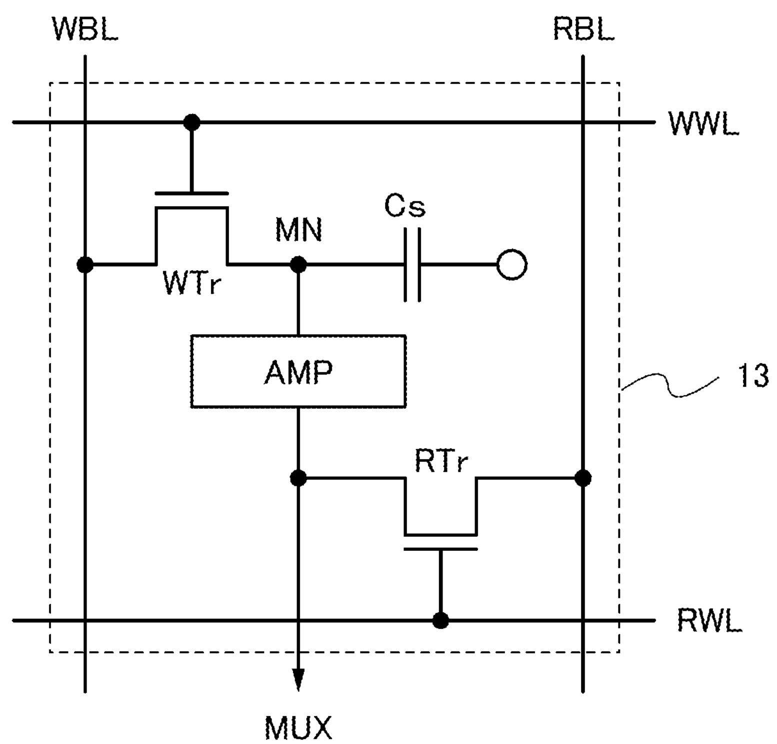
FIG. 3 illustrates a memory element.

FIG. 3 illustrates an example of a memory element that can be included in the memory 113.

A memory element 13 illustrated in FIG. 3 includes a write transistor WTr, a read transistor RTr, a capacitor Cs, a write word line WWL, a read word line RWL, a write bit line WBL, and a read bit line RBL. Note that the read bit line RBL may also serve as the write bit line WBL.

Here, the write transistor WTr is preferably a transistor having high off-state resistance. For example, the transistor having high off-state resistance is preferably a transistor formed using a film of a semiconductor having a wider band gap than silicon. Further, the read transistor RTr is preferably formed using a semiconductor such as silicon.

As the semiconductor having a wider band gap than silicon, a compound semiconductor such as an oxide semiconductor or a nitride semiconductor can be given. In this embodiment, a case of using an oxide semiconductor for the semiconductor film used in the write transistor WTr is described.

The oxide semiconductor used in the write transistor WTr is preferably a purified oxide semiconductor in which impurities serving as electron donors (donors), such as moisture or hydrogen, are reduced and oxygen vacancies are reduced. The purified oxide semiconductor is i-type (intrinsic) or substantially i-type. Therefore, a transistor including the oxide semiconductor has a characteristic of significantly low off-state current. Furthermore, the band gap of the oxide semiconductor is 2 eV or more, preferably 2.5 eV or more, further preferably 3.0 eV or more. With the use of the oxide semiconductor film which is purified by sufficiently reducing the concentration of impurities such as moisture or hydrogen and by reducing oxygen vacancies, the off-state current of the transistor can be significantly reduced.

Note that in this specification and the like, the off-state current is a current that flows between a source and a drain when a transistor is in an off state. In an n-channel transistor (e.g., with a threshold voltage of about 0 V to 2 V), the off-state current means a current that flows between a source and a drain when a negative voltage is applied between a gate and the source.

Specifically, various experiments can prove low off-state current of a transistor that uses a purified oxide semiconductor for a semiconductor film. For example, even with an element with a channel width of $1\times10^{6}$ μm and a channel length of 10 μm, in a range of from 1 V to 10 V of voltage (drain voltage) between a source terminal and a drain terminal, off-state current can be less than or equal to the measurement limit of a semiconductor parameter analyzer, that is, less than or equal to $1\times10^{-13}$ A. In this case, the off-state current density corresponding to a value obtained by dividing the off-state current by the channel width of the transistor is 100 zA/μm or less. In addition, the off-state current density was measured using a circuit in which a capacitor and a transistor were connected to each other and charge flowing into or from the capacitor was controlled by the transistor. For the measurement, the transistor in which a channel formation region is formed in a purified oxide semiconductor film was used, and the off-state current density of the transistor was measured from a change in the amount of charge of the capacitor per unit time. As a result, it has been proven that a lower off-state current density of several tens of yoctoamperes per micrometer (yA/μm) is obtained at a voltage between the source terminal and the drain terminal of the transistor of 3 V. Consequently, it can be said that the off-state current of the transistor in which the channel formation region is formed in the purified oxide semiconductor film is significantly lower than that of a transistor using crystalline silicon.

By using a transistor in which a channel is formed in an oxide semiconductor film as the write transistor WTr, the amount of charge leaking through the write transistor WTr can be suppressed to a significantly small amount when the write transistor WTr is turned off after the potential of a node to which the write transistor WTr and the capacitor Cs are connected is kept constant.

The node to which the write transistor WTr and the capacitor Cs are connected in the memory element 13 is referred to as a memory node MN. In the memory element having this structure, the potential of the memory node MN can be stored as the data. The potential of the memory node MN is output through an amplifier AMP to the multiplexer MUX included in the lookup table 111. The amplifier AMP can be an inverter or may be only one transistor. Further, the write transistor WTr and the capacitor Cs need to have characteristics to hold data. For example, in the case where the off-state resistance of the write transistor WTr is high enough, the capacitance of the capacitor Cs may be relatively low.

The memory element 13 illustrated in FIG. 3 has such a feature that variation in the potential of the memory node MN is limited by the potential of the write bit line WBL. For example, assume that the potential of the memory node MN is at either a high level or a low level and that “1” is stored at the memory node MN in the case of the high level and “0” is stored in the case of the low level. At this time, in the case where the potential of the write bit line WBL is at the low level and variation in the potential of the memory node MN such as a soft error occurs due to any external influence, the potential of the memory node MN may change from the high level to the low level but never changes from the low level to the high level. Further in the case where the potential of the write bit line WBL is at the high level and variation in the potential of the memory node MN occurs due to any influence, the potential of the memory node MN may change from the low level to the high level but never changes from the high level to the low level.

Accordingly, in order to avoid variation of the data stored at the memory node MN, in the case where the write bit line WBL is at the low level, it is preferable that the potential held at the memory node MN be at the low level in many of the memory elements. On the other hand, in the case where the write bit line WBL is at the high level, it is preferable that the potential held at the memory node MN be at the high level in many of the memory elements. In other words, in the case where the write bit line WBL is at the low level, it is preferable if possible that data of the memory elements be “0”, and in the case where the write bit line WBL is at the high level, it is preferable if possible that data of the memory elements be “1”.

However, in the lookup table 111 illustrated in FIG. 2, approximately half of the data stored in the memory 113 is “1” and the other half is “0” probabilistically if the lookup table 111 consists of a combination of normal logic circuits (logical function). Further, when considering statistic data of the actually designed logical functions, about a quarter of the data is “1”, and for this reason it is difficult to reduce the number of either one level of the data to below this proportion.

In consideration of the above, the inverter NV is provided between the input terminal of the multiplexer in the uppermost level and the output terminal of one of the multiplexers in the second uppermost level in the lookup table 111 illustrated in FIG. 2. In this case, half the memory elements on the side provided with the inverter NV in the memory 113 are supplied with data having a parity that is opposite to the parity of the data input to the memory elements on the side not provided with the inverter NV.

For example, assume that “0”, “0”, “0”, “1”, “1”, “1”, “1”, “1” are stored in the memory elements 13*a* to 13*h* in the case where the inverter NV is not provided between the output terminal of the multiplexer MUX6 and the input terminal of the multiplexer MUX7 (see FIG. 10C). In this case, data "1" is stored in 5 bits in the memory 113.

In contrast, in the case where the inverter NV is provided between the output terminal of the multiplexer MUX6 and the input terminal of the multiplexer MUX7 as illustrated in FIG. 2, "0", "0", "0", "1", "0", "0", "0", "0" are stored in the memory elements 13*a* to 13*h* in order to obtain the truth table illustrated in FIG. 10C. In this case, data "1" is stored in only 1 bit in the memory 113.

Thus, by using the lookup table 111 having the structure illustrated in FIG. 2, power consumed for data transfer can be reduced as compared with the case of not providing the inverter.

In the memory element 13 illustrated in FIG. 3, soft errors are less likely to occur than in an SRAM. A cause of the soft errors in an SRAM or the like is electron-hole pair generation due to transmission of alpha rays (generated by nuclear reaction of neutrons derived from cosmic rays) through a semiconductor included in the SRAM. Accordingly, stored data changes from the high level to the low level or from the low level to the high level regardless of the potential held in a bit line in the SRAM. For this reason, if SRAMs are used in the memory 113, there is a possibility that soft errors could occur in all the memory elements. That is, the SRAM storing data "0" and the SRAM storing data "1" have the same probability of occurrence of soft errors.

Meanwhile in the memory element 13 illustrated in FIG. 3, a transistor including an oxide semiconductor is used. Because the oxide semiconductor is formed thin and has a wide band gap, the number of carriers generated by transmission of alpha rays through the oxide semiconductor film is small; thus, soft errors are less likely to occur than in the SRAM. Further, because the relation between the write bit line WBL and the memory node MN is the cause of the data change in the memory element 13 illustrated in FIG. 3 as described above, the data stored in the memory element 13 is set at the low level in the case where the write bit line is at the low level to make the configuration data stored in the memory 113 contain as many pieces of data "0" as possible, whereby the possibility of occurrence of errors can be made extremely low.

Thus, in the case of using the memory element 13 illustrated in FIG. 3 in the memory 113, the possibility of occurrence of errors due to the change of the data in the LUT where the inverter NV is inserted in the binary tree of multiplexers as illustrated in FIG. 2 (the LUT including 1 bit in which data "1" is stored) is one fifth of that in the LUT having the structure illustrated in FIG. 8D (the LUT including 5 bits in which data "1" is stored).

Figure 9A:
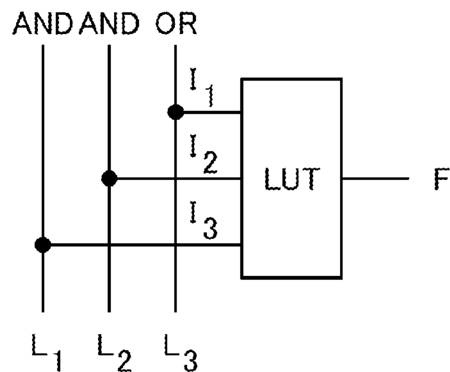
FIGS. 9A to 9F illustrate methods for connecting input terminals of a LUT to wirings.
Figure 9B:
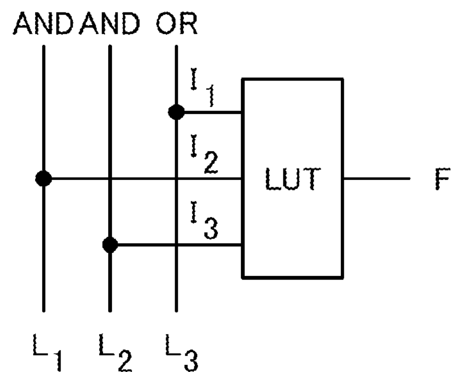
Figure 9C:
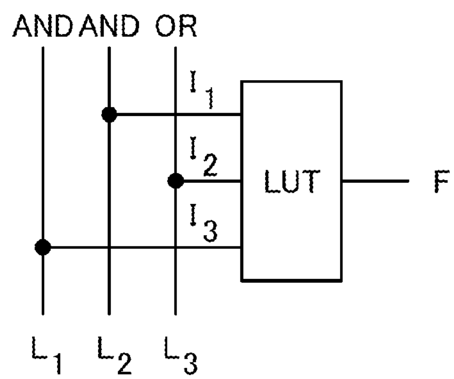
Figure 9D:
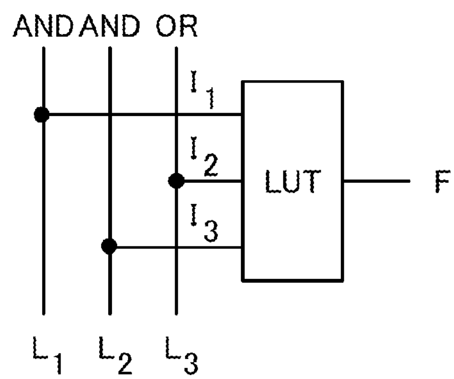
Figure 9E:
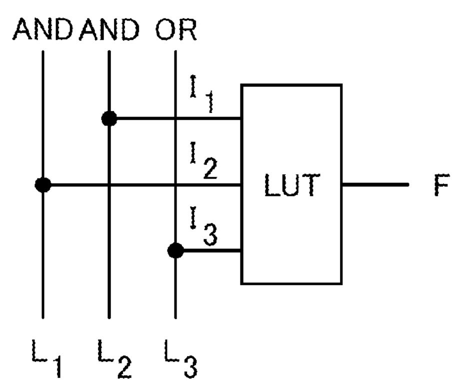
Figure 9F:
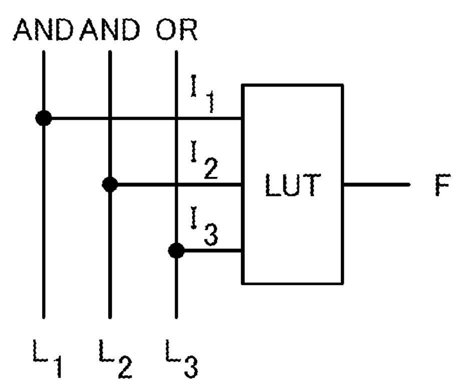

Even when the inverter NV is used, in the case of using the connections illustrated in FIGS. 9A and 9B for example, "1" needs to be stored in 3 bits out of 8 bits in the memory 113. In the case of using the connections illustrated in FIGS. 9C and 9D, "1" needs to be stored in 5 bits out of 8 bits. Accordingly, the connection between the wirings and the input terminals of the LUT should be optimized.

In a special case, the use of an inverter INV in the lookup table 111, on the contrary, increases the number of bits in which "1" is stored. For example, when using a 3-input AND circuit, the number of bits in which "1" is stored in the case of not including an inverter NV is 1, whereas that in the case of including an inverter NV as illustrated in FIG. 2 is 3.

However, the programmable logic device 100 includes many other lookup tables 111 as illustrated in FIG. 1A and it is unlikely that all the lookup tables 111 include 3-input AND circuits. In the case of a 3-input OR circuit, on the other hand, the number of bits in which "1" is stored is decreased from 7 to 3.

In the above description, the lookup tables 111 have 3 inputs; however, lookup tables with 4 inputs, 6 inputs, and 8 inputs also have similar effects.

Figure 4:
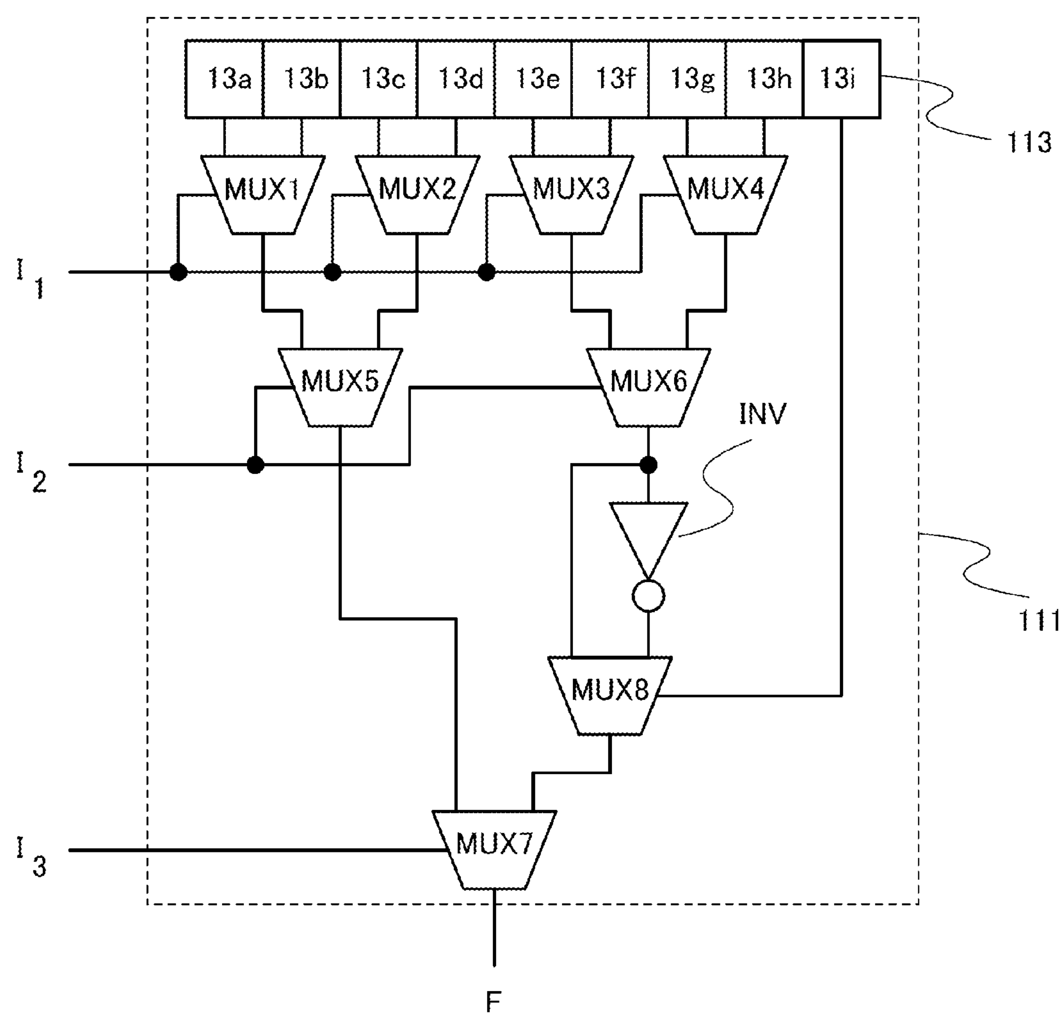
FIG. 4 illustrates a lookup table.

A modification example of the lookup table 111 is illustrated in FIG. 4.

In the lookup table 111 illustrated in FIG. 4, the output of the multiplexer MUX6 is divided into two outputs, and one of the outputs is inverted by the inverter INV. Either the inverted signal or the signal that is not inverted is selected by the multiplexer MUX8 and input to the multiplexer MUX7. The output of the multiplexer MUX8 is determined depending on data of a bit that is added to the memory 113 (a memory element 13*i*). The data of the bit that is added to the memory 113 (the memory element 13*i*) is also written at the time of configuration in a manner similar to that of the other configuration data. Here, if the data is "1", the output from the inverter is selected; if the data is "0", the output that is not from the inverter is selected.

For example, when the configuration data contains a very small number of "1" (e.g., when many AND circuits are incorporated and thus a small number of OR circuits are included), the number of "1" in the configuration data in the lookup table 111 illustrated in FIG. 2 is the same as or, in some cases, rather larger than that in the LUT illustrated in FIG. 8D.

In contrast, in the lookup table 111 illustrated in FIG. 4, the inverter NV is inoperative depending on the circumstances, which can reduce the number of "1" in the configuration data. Note that when the inverter NV is in operation, the number of data "1" contained in the configuration data is increased by one.

An example of the effectiveness of the lookup table 111 illustrated in FIG. 4 will be described below.

Statistically, only very limited kinds of logical functions are mostly used in a LUT. According to Patent Document 2, of logical functions that are applied to a 4-input LUT in a FPGA, 27.2% are logical functions A·B·C·D (AND circuits with 4 inputs of A, B, C, and D; the proportion of "1" is 1/16), 17.0% are logical functions A·B·(C+D) (the proportion of "1" is 3/16), 13.7% are logical functions A·(B+C+D) (the proportion of "1" is 7/16), 12.8% are logical functions A·B+C·D (the proportion of "1" is 7/16), 12.0% are logical functions A·(B+C·D) (the proportion of "1" is 5/16), 5.6% are logical functions A·(B·C+notB·D) (the proportion of "1" is 3/16), and 11.7% are the other logical functions. Note that this data is only statistics and the values may vary to a large extent from the above-mentioned values depending on the design of the circuit.

Table 1 shows a truth table of the logical function A·B·C·D, the logical function A·B·(C+D), the logical function A·(B+C+D), the logical function A·B+C·D, the logical function A·(B+C·D), and the logical function A·(B·C+notB·D).

TABLE 1

| A | B | C | D | A · B · C · D | A · B · (C + D) | A · (B + C + D) | A · B + C · D | A · (B + C · D) | A · (B · C + not B · D) |
|---|---|---|---|---|---|---|---|---|---|
| 0 | 0 | 0 | 0 | 0 | 0 | 0 | 0 | 0 | 0 |
| 0 | 0 | 0 | 1 | 0 | 0 | 0 | 0 | 0 | 0 |

TABLE 1-continued

| A | B | C | D | A · B · C · D | A · B · (C + D) | A · (B + C + D) | A · B + C · D | A · (B + C · D) | A · (B · C + not B · D) |
|---|---|---|---|---|---|---|---|---|---|
| 0 | 0 | 1 | 0 | 0 | 0 | 0 | 0 | 0 | 0 |
| 0 | 0 | 1 | 1 | 0 | 0 | 0 | 1 | 0 | 0 |
| 0 | 1 | 0 | 0 | 0 | 0 | 0 | 0 | 0 | 0 |
| 0 | 1 | 0 | 1 | 0 | 0 | 0 | 0 | 0 | 0 |
| 0 | 1 | 1 | 0 | 0 | 0 | 0 | 0 | 0 | 0 |
| 0 | 1 | 1 | 1 | 0 | 0 | 0 | 1 | 0 | 0 |
| 1 | 0 | 0 | 0 | 0 | 0 | 0 | 0 | 0 | 0 |
| 1 | 0 | 0 | 1 | 0 | 0 | 1 | 0 | 0 | 0 |
| 1 | 0 | 1 | 0 | 0 | 0 | 1 | 0 | 0 | 1 |
| 1 | 0 | 1 | 1 | 0 | 0 | 1 | 1 | 1 | 1 |
| 1 | 1 | 0 | 0 | 0 | 0 | 1 | 1 | 1 | 0 |
| 1 | 1 | 0 | 1 | 0 | 1 | 1 | 1 | 1 | 0 |
| 1 | 1 | 1 | 0 | 0 | 1 | 1 | 1 | 1 | 1 |
| 1 | 1 | 1 | 1 | 1 | 1 | 1 | 1 | 1 | 1 |

Although it is difficult to precisely estimate the proportion of "1" in the other logical functions, given that it is the same as the average proportion of "1" of the top six logical functions (i.e., 21%), the proportion of "1" in the LUT illustrated in FIG. 8D is about 24%.

Meanwhile in the lookup table 111 illustrated in FIG. 2 where half the data in the LUT is inverted and input, the proportion of "1" is about 27%.

Further, in the lookup table 111 illustrated in FIG. 4, it is possible to select whether half the data in the LUT is inverted depending on the logical function; thus, the proportion of "1" can be decreased to less than 15%.

Figure 5:
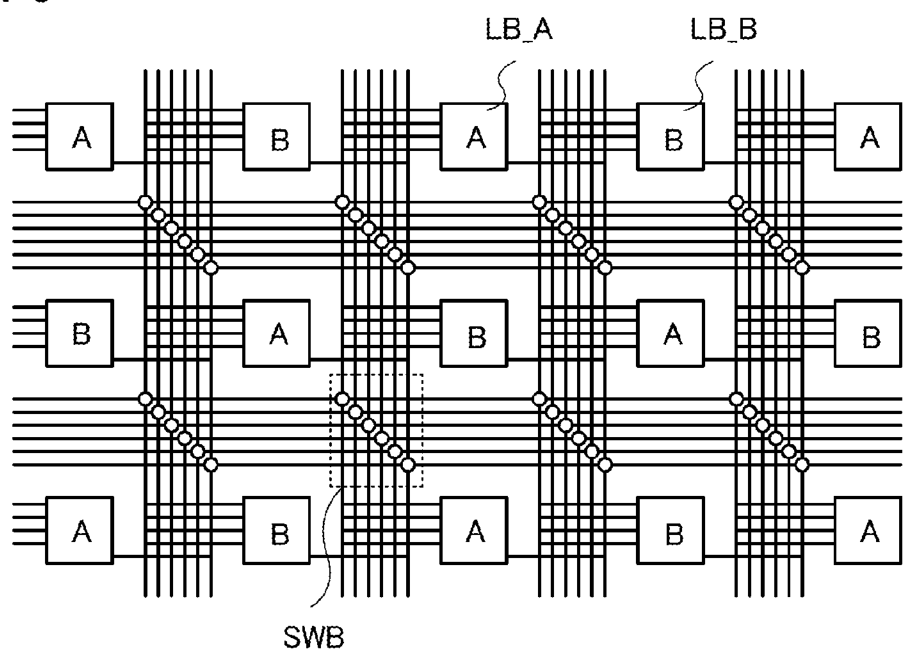
FIG. 5 illustrates logic blocks and switch blocks.

FIG. 5 illustrates an example of a PLD in which logic blocks are arranged in a matrix.

In FIG. 5, a plurality of logic blocks LB_A and a plurality of logic blocks LB_B are provided in a matrix and a plurality of switch blocks SWB and wirings are provided to connect the logic blocks. Here, LUTs each including an inverter NV as illustrated in FIG. 2 are used for the logic blocks LB_A, and LUTs not including an inverter NV as illustrated in FIG. 8D are used for the logic blocks LB_B.

According to Patent Document 2, in a 4-input LUT, the percentage of appearance of the logical functions (A·(B+C+D), A·B+C·D, and A·(B+C·D)) with which the proportion of "1" is decreased in the case of providing an inverter NV as in the lookup table 111 illustrated in FIG. 2 is about 39%. Given that the other logical functions also exist at the same percentages as those in Patent Document 2, the percentage of appearance of the logical functions with which the proportion of "1" is decreased in the case of providing an inverter INV is about 44%.

Accordingly, the logic blocks LB_A are used for the logical functions (A·(B+C+D), A·B+C·D, and A·(B+C·D)) and the logic blocks LB_B are used for the other logical functions; in this way, effects similar to those in the case of using the logic circuit illustrated in FIG. 4 can be obtained. Note that although the logic blocks LB_A and the logic blocks LB_B are provided in equal proportions in FIG. 5, the proportions thereof may be different from each other. In the case where a plurality of LUTs are included in one logic block, two kinds of LUTs (the LUT illustrated in FIG. 2 and the LUT illustrated in FIG. 8D) may be included therein; in such a case, similar effects can also be obtained.

Figure 6:
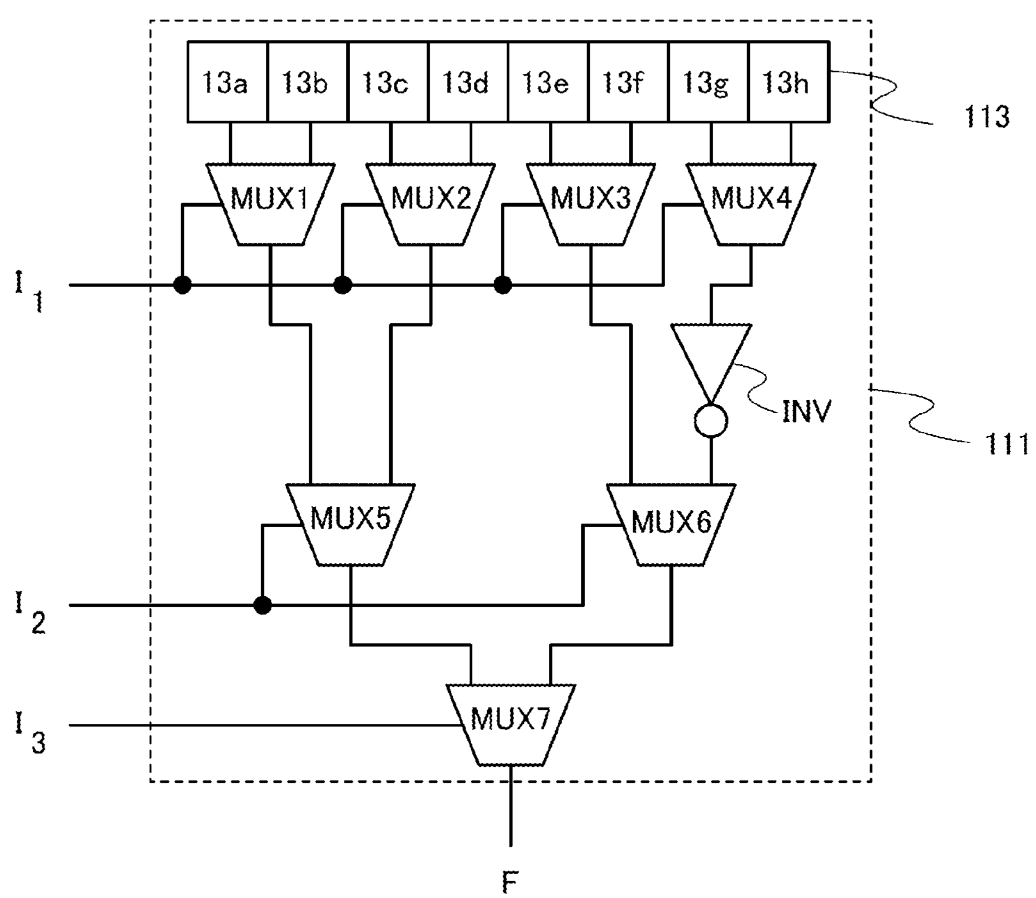
FIG. 6 illustrates a lookup table.

Further, by appropriately selecting the location for an inverter NV, the number of "1" in the configuration data can be reduced. For example, in the case where the proportion of "1" in the data of the LUT illustrated in FIG. 8D is about 25%, the inverter NV is preferably inserted between the output terminal of the multiplexer MUX4 and the input terminal of the multiplexer MUX6 as illustrated in FIG. 6. In other words, such a structure as to invert 25% of the data of the LUT is preferably employed.

Although FIG. 6 illustrates a 3-input LUT, when this idea is put into a 4-input LUT, the proportion of "1" in the data of the LUT can be decreased to about 15% according to Patent Document 2.

In one embodiment of the present invention, configuration data input to a LUT can be optimized. Specifically, the number of "0" in the configuration data input to a memory included in the LUT can be increased. Consequently, power consumed for configuration data transfer can be reduced. Further, repetition of "0" in the configuration data can reduce power consumed by a PLD.

By employing the structure illustrated in FIG. 3 with the use of a transistor including an oxide semiconductor for the memory included in the LUT, the possibility of occurrence of soft errors can be made low.

Embodiment 2

In this embodiment, an example of a cross-sectional structure of a semiconductor device is described with reference to FIG. 7.

Figure 7:
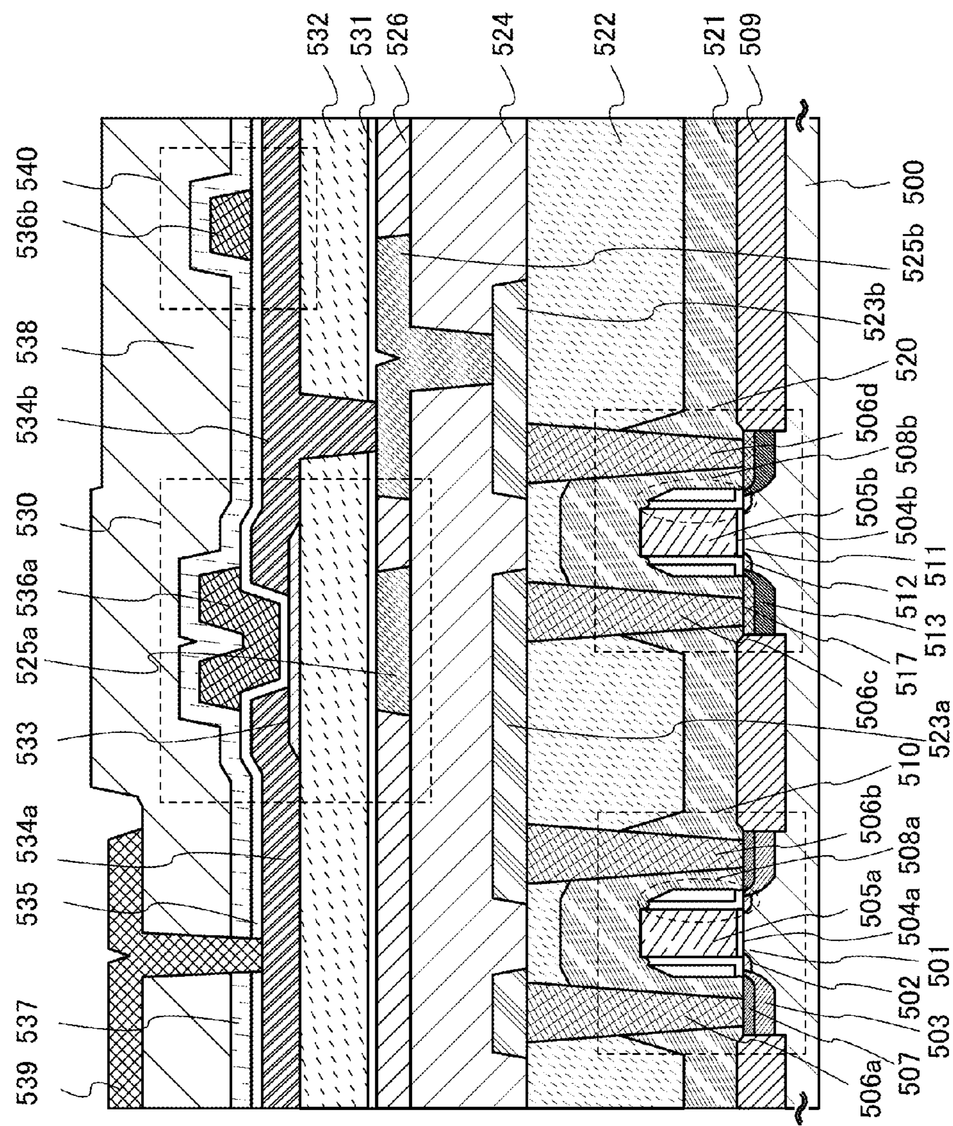
FIG. 7 is a cross-sectional view of a semiconductor device.

The semiconductor device illustrated in FIG. 7 is the memory element described in the above embodiment, in which the transistors are provided so as to overlap with one another. A lower part of the semiconductor device includes transistors including a first semiconductor material (e.g., silicon), and an upper part of the semiconductor device includes a transistor including a second semiconductor material (e.g., oxide semiconductor).

<Structure of Transistor in Lower Portion>

An n-channel transistor 510 includes a channel formation region 501 provided in a substrate 500 including a semiconductor material, low-concentration impurity regions 502 and high-concentration impurity regions 503 (collectively simply referred to as impurity regions in some cases) with the channel formation region 501 provided between the impurity regions, intermetallic compound regions 507 provided in contact with the impurity regions, a gate insulating film 504*a* provided over the channel formation region 501, a gate electrode layer 505*a* provided over the gate insulating film 504*a*, and a source electrode layer 506*a* and a drain electrode layer 506*b* provided in contact with the intermetallic compound regions 507. Sidewall insulating films 508*a* are provided on side surfaces of the gate electrode layer 505*a*. An interlayer insulating film 521 and an interlayer insulating film 522 are provided to cover the transistor 510. The source electrode layer 506*a* and the drain electrode layer 506*b* are connected to the intermetallic compound regions 507 through openings formed in the interlayer insulating film 521 and the interlayer insulating film 522.

A p-channel transistor 520 includes a channel formation region 511 provided in the substrate 500 including the semiconductor material, low-concentration impurity regions 512 and high-concentration impurity regions 513 (collectively simply referred to as impurity regions in some cases) with the channel formation region 511 provided between the impurity regions, intermetallic compound regions 517 provided in contact with the impurity regions, a gate insulating film 504*b* provided over the channel formation region 511, a gate electrode layer 505*b* provided over the gate insulating film 504*b*, and a source electrode layer 506*c* and a drain electrode layer 506*d* provided in contact with the intermetallic compound regions 517. Sidewall insulating films 508*b* are provided on side surfaces of the gate electrode layer 505*b*. The interlayer insulating film 521 and the interlayer insulating film 522 are provided to cover the transistor 520. The source electrode layer 506*c* and the drain electrode layer 506*d* are connected to the intermetallic compound regions 517 through openings formed in the interlayer insulating film 521 and the interlayer insulating film 522.

Further, element separation insulating films 509 are provided for the substrate 500 to surround each of the transistor 510 and the transistor 520.

Although the case where the channels of the transistors 510 and 520 are formed in the semiconductor substrate is illustrated in FIG. 7, the channels of the transistors 510 and 520 may be formed in an amorphous semiconductor film or a polycrystalline semiconductor film formed over an insulating surface. Alternatively, the channels may be formed in a single crystal semiconductor film, like the case of using an SOI substrate.

When the transistors 510 and 520 are formed using a single crystal semiconductor substrate as the semiconductor substrate, the transistors 510 and 520 can operate at high speed. Although not shown in FIG. 7, it is preferable that the multiplexers and the like described in the above embodiment also be formed using a single crystal semiconductor substrate.

The transistor 510 and the transistor 520 are connected to each other through a wiring 523*a*, and an insulating film 524 is provided over the wiring 523*a*. Further, conductive layers 525*a* and 525*b* and an insulating film 526 are provided over the insulating film 524. The insulating film 526 is preferably formed in such a manner that after the conductive layers 525*a* and 525*b* are formed over the insulating film 524, an insulating film 526 is formed over the conductive layers 525*a* and 525*b* and then the insulating film 526 is subjected to polishing treatment until upper surfaces of the conductive layers 525*a* and 525*b* are exposed.

<Structure of Transistor in Upper Portion>

A transistor 530 in an upper portion is a transistor whose channel is formed in a film of a semiconductor having a wider band gap than silicon. The transistor 530 includes the conductive layer 525*a* provided over the insulating film 524, an insulating film 531 and an insulating film 532 provided over the conductive layer 525*a*, a semiconductor film 533 provided over the insulating film 532, a source electrode layer 534*a* and a drain electrode layer 534*b* provided in contact with the semiconductor film 533, a gate insulating film 535 provided over the semiconductor film 533, the source electrode layer 534*a*, and the drain electrode layer 534*b*, and a gate electrode layer 536*a* provided over the gate insulating film 535. Note that the conductive layer 525*a* serves as a gate electrode layer.

FIG. 7 illustrates the case where upper and lower gate electrode layers are provided with a semiconductor film provided therebetween. A signal for controlling an on state and an off state may be supplied to one of the gate electrode layers and the other of the gate electrode layers may be in a state where a potential is supplied from somewhere else. In this case, potentials with the same level may be supplied to the pair of gate electrode layers, or a fixed potential such as a ground potential may be supplied only to the other of the gate electrode layers. By controlling the level of a potential supplied to the other of the gate electrode layers, the threshold voltage of the transistor can be controlled.

A conductive layer 536*b* is provided over the drain electrode layer 534*b* with the gate insulating film 535 sandwiched therebetween. The drain electrode layer 534*b*, the gate insulating film 535, and the conductive layer 536*b* form a capacitor 540.

Further, an interlayer insulating film 537 and an interlayer insulating film 538 are provided to cover the transistor 530 and the capacitor 540. The source electrode layer 534*a* is connected to a wiring 539 through an opening formed in the interlayer insulating film 537 and the interlayer insulating film 538.

The drain electrode layer 534*b* is connected to the conductive layer 525*b* through an opening formed in the insulating film 532 and the insulating film 531. The conductive layer 525*b* is connected to the wiring 523*b* through an opening formed in the insulating film 524. Further, the wiring 523*b* is connected to the drain electrode layer 506*d* of the transistor 520.

As the semiconductor having a wider band gap than silicon, a compound semiconductor such as an oxide semiconductor or a nitride semiconductor can be given. In this embodiment, the case where an oxide semiconductor is used for the semiconductor film 533 is described.

The oxide semiconductor used for the transistor 530 is preferably a purified oxide semiconductor in which impurities serving as electron donors (donors), such as moisture or hydrogen, are reduced and oxygen vacancies are reduced. The purified oxide semiconductor is an i-type (intrinsic) semiconductor or a substantially i-type semiconductor. Therefore, a transistor including the oxide semiconductor has a characteristic of significantly small off-state current. The band gap of the oxide semiconductor is 2 eV or more, preferably 2.5 eV or more, further preferably 3.0 eV or more. With the use of the oxide semiconductor film which is purified by sufficiently reducing the concentration of impurities such as moisture or hydrogen and by reducing oxygen vacancies, the off-state current of the transistor can be significantly reduced.

Specifically, various experiments can prove small off-state current of a transistor in which a purified oxide semiconductor is used for a semiconductor film. For example, even in an element with a channel width of $1\times10^{6}$ μm and a channel length of 10 μm, in a range from 1 V to 10 V of voltage (drain voltage) between a source terminal and a drain terminal, off-state current can be smaller than or equal to the measurement limit of a semiconductor parameter analyzer, that is, smaller than or equal to $1\times10^{-13}$ A. In this case, it can be found that an off-state current density corresponding to a value obtained by dividing the off-state current by the channel width of the transistor is less than or equal to 100 zA/μm. In addition, a capacitor and a transistor were connected to each other and an off-state current density was measured by using a circuit in which electric charge flowing into or from the capacitor was controlled by the transistor. In the measurement, the purified oxide semiconductor film was used for a channel formation region in the transistor, and the off-state current density of the transistor was measured from change in the amount of electric charge of the capacitor per unit time. As a result, it is found that, in the case where the voltage between the source terminal and the drain terminal of the transistor is 3 V, a smaller off-state current density of several tens of yoctoamperes per micrometer (yA/μm) can be obtained. Consequently, it can be said that a transistor whose channel formation region is formed in a purified oxide semiconductor film has much smaller off-state current than a transistor including silicon.

The oxide semiconductor preferably includes at least indium (In) or zinc (Zn). As a stabilizer for reducing variation in electric characteristics of a transistor including the oxide semiconductor, it is preferable that one or more selected from gallium (Ga), tin (Sn), hafnium (Hf), aluminum (Al), and zirconium (Zr) be contained.

As another stabilizer, one kind or a plurality of kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, it is possible to use indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio in the vicinity of the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio in the vicinity of the above atomic ratios may be used.

For example, with an In—Sn—Zn-based oxide, high mobility can be achieved relatively easily. However, even with an In—Ga—Zn-based oxide, mobility can be increased by reducing the defect density in the bulk.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

Note that in most cases, a crystal part in the CAAC-OS film fits inside a cube whose one side is less than 100 nm. In an image obtained with a transmission electron microscope (TEM), a boundary between crystal parts in the CAAC-OS film is not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term “perpendicular” includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

In the case where the gate insulating films are formed using the same material, the amount of shift of the threshold voltage of the transistor can be controlled by the thickness ratio between the gate insulating films. When the thickness ratio of one of the gate insulating films to the other of the gate insulating films is 1:10, the amount of shift of the threshold voltage of the transistor tends to be high as compared to the case where the thickness ratio is 1:1.

It is preferable that hydrogen not be contained in the semiconductor film 533 before, during, and after the deposition. For example, it is preferable that the semiconductor film 533 be formed so as to contain hydrogen as little as possible at the time of the deposition of the semiconductor film 533 and that heat treatment for dehydration or dehydrogenation be performed after the deposition of the semiconductor film 533. Further, it is preferable that an insulating film in contact with the semiconductor film 533 be formed so as to contain hydrogen as little as possible at the time of the deposition of the insulating film and that heat treatment for dehydration or dehydrogenation be performed after the deposition of the insulating film.

When a film which prevents hydrogen from passing therethrough is used as the insulating film 531, hydrogen contained in the transistors in the lower portion, the insulating film 524, the interlayer insulating film 522, and the like can be prevented from reaching the semiconductor film 533. As the film which prevents hydrogen from passing therethrough, a silicon nitride film, a silicon oxynitride film, an aluminum oxide film, an aluminum oxynitride film, or the like is preferably used. In addition, when a film which prevents hydrogen from passing therethrough is used as the interlayer insulating film 537, hydrogen contained in the interlayer insulating film 538 can be prevented from reaching the semiconductor film 533.

Treatment for supplying oxygen to the semiconductor film 533 is preferably performed in order to reduce oxygen vacancies contained in the semiconductor film 533. For example, when an insulating film containing an excess amount of oxygen is provided in contact with the semiconductor film 533 and heat treatment is performed, oxygen can be supplied to the semiconductor film 533 from the insulating film containing an excess amount of oxygen. Oxygen is supplied to the semiconductor film 533, whereby oxygen vacancies contained in the semiconductor film 533 can be reduced. Treatment for adding oxygen to the semiconductor film 533 may be performed after the semiconductor film 533 is subjected to dehydration or dehydrogenation treatment. As the treatment for adding oxygen, an oxygen radical, ozone, an oxygen atom, an oxygen ion, or the like is added to the semiconductor film 533 by an ion implantation method, an ion doping method, plasma treatment, or the like, for example. The treatment for adding oxygen may be performed through the gate insulating film 535.

When the amount of impurities and oxygen vacancies in the semiconductor film 533 is reduced in this manner, generation of carriers can be suppressed. Suppressing the increase in carrier density can suppress negative shift of the threshold voltage of the transistor due to the carrier density. As a result, the threshold voltage of the transistor can be easily controlled by a potential applied to the other of the gate electrodes of the transistor.

This embodiment can be implemented in combination with the other embodiment as appropriate.

This application is based on Japanese Patent Application serial no. 2012-104853 filed with Japan Patent Office on May 1, 2012, the entire contents of which are hereby incorporated by reference.

What is claimed is:

1. A lookup table comprising:

a memory configured to store configuration data;

a plurality of multiplexers each configured to select one signal from a plurality of input signals in accordance with the configuration data supplied from the memory and output the one signal; and an inverter, wherein the plurality of multiplexers are connected in a binary tree with multiple levels, wherein the inverter is provided between an output terminal of a multiplexer in a level and a first input terminal of input terminals of a multiplexer in one level higher than the level, wherein inputs to others of the input terminals of the multiplexer in one level higher than the level are not connected to inverters, and wherein signal selection is performed in each of the multiplexers so that a multiplexer in an uppermost level outputs, as an output signal, one signal of all input signals of the multiplexers in a lowermost level.

2. The lookup table according to claim 1, wherein each input terminal of the multiplexers in the lowermost level is connected to one corresponding memory element, and wherein the memory element includes a transistor and a capacitor.

3. The lookup table according to claim 2, wherein the transistor includes a semiconductor film having a band gap of 3.0 eV or more.

4. The lookup table according to claim 2, wherein the configuration data is stored at a node to which one of a source and a drain of the transistor and one of a pair of electrodes of the capacitor are connected.

5. The lookup table according to claim 2, wherein the transistor comprises an oxide semiconductor layer including a channel formation region.

6. A programmable logic device comprising the lookup table according to claim 1.

7. The lookup table according to claim 1, wherein the multiplexer in the level corresponds to a multiplexer in the lowermost level.

8. The lookup table according to claim 1, wherein the multiplexer in one level higher than the level corresponds to the multiplexer in the uppermost level.

9. A lookup table comprising:

a memory configured to store configuration data; and a plurality of multiplexers each configured to select one signal from a plurality of input signals in accordance with the configuration data supplied from the memory and output the one signal;

wherein an output of one of the plurality of multiplexers in a level is inverted and input to a first input terminal of input terminals of a multiplexer in one level higher than the level, wherein inputs to others of the input terminals of the multiplexer in one level higher than the level are not inverted, wherein the plurality of multiplexers are connected in a binary tree with multiple levels, and wherein signal selection is performed in each of the multiplexers so that a multiplexer in an uppermost level outputs, as an output signal, one signal of all input signals of the multiplexers in a lowermost level.

10. The lookup table according to claim 9, wherein each input terminal of the multiplexers in the lowermost level is connected to one corresponding memory element, and wherein the memory element includes a transistor and a capacitor.

11. The lookup table according to claim 10, wherein the transistor includes a semiconductor film having a band gap of 3.0 eV or more.

12. The lookup table according to claim 10, wherein the configuration data is stored at a node to which one of a source and a drain of the transistor and one of a pair of electrodes of the capacitor are connected.

13. The lookup table according to claim 10, wherein the transistor comprises an oxide semiconductor layer including a channel formation region.

14. A programmable logic device comprising the lookup table according to claim 9.

15. The lookup table according to claim 9, wherein the one of the plurality of multiplexers in the level corresponds to a multiplexer in the lowermost level.

16. The lookup table according to claim 9, wherein the multiplexer in one level higher than the level corresponds to the multiplexer in the uppermost level.

* * * * *